United States Patent
Erhage et al.

[11] Patent Number: 6,147,560
[45] Date of Patent: Nov. 14, 2000

[54] METHOD AND DEVICE RELATING TO SUPERVISION AND CONTROL OF AN OSCILLATOR SIGNAL

[75] Inventors: Lars I. Erhage, Göteborg; Östen E. Erikmats, Mölnlycke; Svenolov Rizell, Gråbo; Håkan L. Karlsson, Kungsbacka, all of Sweden

[73] Assignee: Telefonaktiebolget LM Ericsson, Stockholm, Sweden

[21] Appl. No.: 09/013,220

[22] Filed: Jan. 26, 1998

[30] Foreign Application Priority Data

Jan. 28, 1997 [SE] Sweden ................................. 9700245

[51] Int. Cl.$^7$ ............................. H03B 23/00; H03L 7/00
[52] U.S. Cl. ................ 331/1 R; 331/12; 331/4; 329/304; 329/307; 329/308; 342/194; 342/199; 342/200
[58] Field of Search ................ 331/74, 1 R, 12, 331/4; 342/194, 199, 200; 375/375; 455/260, 255; 329/304, 308, 307

[56] References Cited

U.S. PATENT DOCUMENTS

| | | | |
|---|---|---|---|
| 4,129,832 | 12/1978 | Neal et al. | 331/44 |
| 4,499,435 | 2/1985 | Thomson et al. | 331/44 |
| 4,593,287 | 6/1986 | Nitardy | 342/200 |
| 4,603,305 | 7/1986 | McCune | 331/4 |
| 4,647,873 | 3/1987 | Beckner et al. | 331/4 |
| 4,831,373 | 5/1989 | Hess | 340/825.03 |
| 4,916,405 | 4/1990 | Keate et al. | 331/4 X |
| 5,028,886 | 7/1991 | Seibel et al. | 331/4 |
| 5,172,123 | 12/1992 | Johnson | 342/200 |
| 5,379,001 | 1/1995 | Hedtke | 331/4 |
| 5,530,406 | 6/1996 | Duran et al. | 331/12 |
| 5,533,019 | 7/1996 | Jayapalan | 370/352 |
| 5,557,241 | 9/1996 | Burke | 331/4 |
| 5,721,762 | 2/1998 | Sood | 455/466 |

FOREIGN PATENT DOCUMENTS

| | | |
|---|---|---|
| 0 423 941 A2 | 4/1991 | European Pat. Off. . |
| 0 505 121 A2 | 9/1992 | European Pat. Off. . |
| 2 294 610 | 5/1996 | United Kingdom . |
| WO 97/22226 | 6/1997 | WIPO . |

OTHER PUBLICATIONS

International Search Report issued on Sep. 2, 1998 in connection with counterpart PCT Application No. SE97/02118.

*Primary Examiner*—Arnold Kinkead
*Attorney, Agent, or Firm*—Burns, Doane, Swecker & Mathis, L.L.P.

[57] ABSTRACT

The present invention relates to methods and devices for such control and supervision of an oscillator signal from a controllable oscillator that is done mainly to control the frequency variation of the oscillator signal. According to the invention, the controllable oscillator is controlled by a controlling voltage, which in turn is modified by a correction signal, generated in a control loop. A time discrete representation of a secondary phase is generated in the control loop, the secondary phase corresponding to a frequency being the difference between the frequency of the oscillator signal and a constant frequency. A time discrete approximation signal is generated in dependence of the time discrete representation of the secondary phase. A time discrete error signal is generated in dependence of the time discrete approximation signal, the time discrete error signal indicating the difference between the actual frequency slope of the oscillator signal and a desired frequency slope. The correction signal is generated in dependence of the time discrete error signal. The control loop can also be adaptive, meaning that data from one control sequence is being used in a later control sequence.

22 Claims, 5 Drawing Sheets

METHOD AND DEVICE RELATING TO SUPERVISION AND CONTROL OF AN OSCILLATOR SIGNAL

THE TECHNICAL FIELD OF THE INVENTION

The invention relates to methods and devices for such control and supervision of an oscillator signal that is done mainly to control frequency variation of the oscillator signal. More specific the invention relates to control of an oscillator signal from a controllable oscillator and the supervision of the oscillator signal for determining the frequency slope of the oscillator signal.

PRIOR ART

A voltage controlled oscillator—commonly named VCO—is a well-known device, commonly used within varying technical fields, e.g. within the field of radio technology. The voltage controlled oscillator generates an oscillating signal the frequency of which is controlled through a control voltage fed to the oscillator.

In a number of technical applications the need arises to control the oscillator signal frequency such that the frequency varies with time in a manner suitable for the relevant application.

One such application exists in an aircraft radar equipment using a HPD-waveform (High Pulse Repetition Frequency Doppler Radar). In such a radar it is desirable to generate an oscillator signal, the frequency of which varies as follows. At first the frequency is to be constant for a set period of time. Thereafter the frequency is to increase linearly with time up to a maximum frequency. Finally the frequency is to decrease linearly with time from the maximum frequency down to the original frequency level.

This frequency variation is utilised in modulating the signal emitted from the radar antenna. The emitted signal is reflected against the target and is then received by the radar antenna. Through observation of the variations in the differences in frequency between the emitted signal and the received signal the distance to the target and the speed of the target can be obtain. In order to obtain a good accuracy in measurements of the target distance and to obtain an effective suppression of ground echoes a very good linearity is required as to the frequency variations.

A further such application is testing equipment for spectral analysis. In such an analysis the aim is to establish the spectral composition of a test signal. This is accomplished by mixing the test signal with an oscillating reference signal, the frequency of which varies linearly with time. Through the mixing a new signal is obtained, and this new signal is passed through a narrow bandpass filter.

It can be shown that the output signal from the bandpass filter is a signal which instantaneously oscillates with a frequency equal to the difference between the reference signal frequency and the centre frequency of the bandpass filter. It can also be shown that the output signal from the bandpass filter has an instantaneously peak value which is proportional to the value of the fourier transform of the test signal at a frequency which is equal to the difference between the reference signal frequency and the centre frequency of the bandpass filter.

The value of the Fourier transform of the test signal as a function of the frequency may easily be illustrated with the use of an oscilloscope. In order to accomplish this, the output signal from the bandpass filter is first fed to a peak value detector and thereafter the output signal from the peak value detector is fed to the oscilloscope.

The relationship between the frequency and the control voltage in a voltage controlled oscillator is usually not totally linear. This makes it harder to generate a frequency sweep, the frequency of which varies linearly with time. If the relationship between the control voltage and the frequency had been linear the result had been a linear frequency sweep if the control voltage fed to the oscillator had been a linearly, with respect to time varying voltage, a ramp voltage, and such a ramp voltage is relatively easy to generate.

In order to generate an oscillator signal, the frequency of which varies with respect to time in a desired manner, using a voltage controlled oscillator, the control voltage thus must vary with time in a rather complicated way. The variation in the control voltage is determined partly by the desired frequency variations, and partly by the relation between frequency and control voltage in the voltage controlled oscillator.

It is of course possible to measure the correlation between frequency and control voltage, and having this correlation construct a control voltage generator, which generates a control voltage giving the desired result. In order to obtain high performance in e.g. a radar application, a very accurate mapping of the correlation between frequency and control voltage is required, the accuracy may often be in the order of thousands of measurement values.

A further difficulty is that the correlation between the frequency and the control voltage, i.a. is dependent of the ambient temperature. This implies that the measurements have to be made over again as the temperature changes; alternatively, measurement values have to be stored which describe the correlation between frequency and control voltage at a great number of temperatures. The first alternative is time consuming. The second alternative requires a great quantity of memory, and as the correlation between the control voltage and the frequency also changes as the oscillator components ages the measurements have to be repeated at even time intervals.

In order to circumvent these problems some form of a closed control sequence of the oscillator signal is used. In such a type of control sequence, an error indication signal generally is generated, which in some way indicates the deviation of the oscillator signal actual variation as compared to the desired variation. The error indication signal is used in order to generate a correction signal, which in turn is used for modifying the control signal fed to the oscillator, such that the oscillator emits an oscillator signal, the variation of which, as time passes, corresponds to the desired variation.

Several methods describing how to control the frequency of a frequency controlled oscillator such that the frequency vies with time in a desired manner are can be found in the patent literature.

In U.S. Pat. No. 4,129,832 is described that the aim is to accomplish a linear frequency variation from a voltage controlled oscillator. This is accomplished through the calibration of a control signal. The control signal is obtained by successive D/A-conversion of values stored in a RAM memory, through integration of the results of the D/A-conversion and by feeding the result of the integration in the form of a control signal to the voltage controlled oscillator.

In order to obtain a linear sweep the values in the RAM-memory have to be calibrated, which calibration proceeds as follows. The oscillator signal is mixed with a time delayed version of itself, whereat the result of this mixing is lowpass filtered. The resulting signal obtains a frequency, which mainly is proportional to the frequency slope—i.e. the frequency change per second—in the oscillator signal. This signal, the frequency of which depends on the frequency slope, is compared on an oscilloscope with a signal having constant frequency corresponding to the desired frequency slope of the sweep. The values in the RAM-memory are manually adjusted until the two curves are made to coincide on the screen of the oscilloscope.

One drawback of this method is that the method is manual. In a system having high demands on linearity in the frequency variations the calibration must be made automatically.

In U.S. Pat. No. 5,172,123 the aim is to obtain a linear frequency variation from a voltage controlled oscillator. the substance described in this patent publication may to, some extent, be said to be an automation of the method described in the above patent publication.

A detector signal is generated in similar manner as in the above mentioned patent publication, which detector signal frequency is principally proportional to the frequency slope of the oscillator signal. The detector signal is analysed through a zero crossing detector, which generates a square wave, the zero crossings of which are simultaneous to the zero crossings of the detector signal. The square wave is used to control two counters, which when they are activated counts the number of pulses which are generated having a fixed frequency. The number of pulses counted becomes an indication of the frequency slope of the oscillator signal. A desired value corresponding to the number of pulses that the counter would count if the oscillator signal exhibited the desired frequency slope is deducted from the number of pulses, whereat a time discrete error indication signal is obtained.

The correction values stored in a RAM-memory are successively D/A-converted and the result of the D/A-conversion is integrated. The result of the integration is fed, after amplification, as a control signal to the voltage controlled oscillator.

Every value of the time discrete error indication signal is added to a corresponding correction value which is derived from the RAM-memory. The resultant value of the addition is stored at the location of the correction values in the RAM-memory, whereby a new improved correction value is obtain, which is used in the next control sequence of the frequency variations.

A drawback of this method is that it demands quite an amount of complicated electronics.

In U.S. Pat. No. 4,647,873 the described aim is to obtain a linear frequency variation from a voltage controlled oscillator. For this purpose, a circuit is used in controlling phase or frequency of the oscillator signal. The circuit comprises a voltage controlled oscillator, an error measuring system, an adaptive correction system and a control voltage generator.

The error in regard to phase or in frequency measured by the error measurement system is used for correction of the, by the control generator generated control voltage, which is used in controlling the oscillator. This correction is done partly in a broadband loop, and partly in an adaptive loop. The broadband loop is used for correction of fast varying random errors and the adaptive loop is used for correction of slowly varying non-linearity in the voltage controlled oscillator, e.g. caused by temperature variations.

In the broadband loop the error signal is used directly for correction of the control signal, simply by adding the error signal to the control signal from the control voltage generator.

In the adaptive loop the error signal is used according to the following. The error signal is sampled at determined points of time and are A/D-converted. The correction values, which are retrieved from a RAM-memory are partly added to the A/D-converted error signals. This process is called "fading memory"-process in the document and is used with the aim to obtain a stable system. The result from the "fading memory"-process, at a certain sampling point of time, is stored in the same memory location as the correction value for the corresponding sampling points of time were stored, and are thus used in the process as a new correction value for the corresponding sampling point of time in the next sweep.

The correction value which at a given sampling point of time is retrieved from the RAM-memory for the use in the "fading memory"-process is also used to correct the control signal for the oscillator. The correction value is D/A-converted, the result of the conversion of the D/A-conversion is lowpass filtered and is thereafter used as a corrections signal which is added to the control signal from the control voltage generator.

This method has a draw-back in that the error signal is based on deviations in phase or frequency. In generating a linear frequency variation, a time dependent desired value must be generated, which makes higher demands on time precision and precision in the error measuring system.

DESCRIPTION OF THE INVENTION

The invention is aimed at solving the problem of an effective way of supervision and control of a oscillator signal from a controllable oscillator, for example a VCO, in such a way that the frequency of the oscillator may be made to vary with time in a predetermined way; it must especially in this respect be possible to vary the frequency linearly in respect of time with high precision.

The problem may generally be solved according to the following. A correction signal is generated. The correction signal is generated in a control loop and is used to modify the control signal, which controls the oscillator. In the control loop a time discrete representation of a secondary phase is generated, the time discrete representation representing the secondary phase at a number of points of time. The secondary phase is such that the frequency corresponding to the secondary phase is equal to the difference between the oscillator signal frequency and a constant frequency. In the control loop a time discrete approximation signal is generated from the time discrete representation of the secondary phase. The signal values of the time discrete approximation signal, corresponding to different points of time, represent approximations to the second derivative with respect to time (second time derivative) of the secondary phase at the different points of time. The second time derivative of the secondary phase is related to the actual frequency slope of the oscillator signal. The time discrete approximation signal thus contains information as to the actual frequency slope of the oscillator signal. A time discrete error indication signal is generated in dependence of the time discrete approximation signal. The time discrete error indication signal indicates the deviation of the oscillator signal actual frequency slope as compared to the desired frequency slope. In the control loop the correction signal is generated in dependence of the time discrete error indication signal. The control loop may be adaptive whereby data generated in one control sequence are used in the next control sequence. The aim of the invention is thus to use the time discrete approximation signal for determining the oscillator signal frequency slope and to use a closed-loop control sequence in controlling the oscillator to control the oscillator signal frequency, such that this frequency varies with time in a predetermined manner, and that the invention comprises methods and devices for these purposes.

This problem is more specifically solved according to the following. In the control loop the oscillator signal is quadrature demodulated. In the quadrature demodulation of the oscillator signal a first quadrature signal is generated having the secondary phase and a second quadrature signal having a phase $\pi/2$ from the secondary phase. The first and the second quadrature signal (in-phase and quadrature phase) are A/D-converted at a number of points of time, whereby a time discrete first quadrature signal (in-phase) and a time discrete second quadrature signal (quadrature phase) are generated. The time discrete first quadrature signal combined with the time discrete second quadrature signal constitute the time discrete representation of the secondary phase. In dependence of the time discrete quadrature signals, a time discrete differential signal is generated, which represents the first differences of the secondary phase between different points of time. In dependence of the time discrete differential signal the time discrete approximation signal is generated, such that it represents second differences of the secondary phase between different points of time. In an adaptive control sequence of the oscillator, a number of stored correction values, which are generally generated at preceding control sequence of the oscillator have been stored in a memory. In dependence of the stored correction values and the time discrete error indication signal new correction values are generated in the control loop. The generation of the new correction values may herewith be made by generating a first and a second time discrete lowpass signal, respectively, through time discrete lowpass filtering of the time discrete error indication signal and the stored correction values, respectively, whereby the new correction values are generated in dependence of the first and the second time discrete lowpass signal. The new correction values may substitute the stored old correction values. The new correction values are D/A-converted and the result of the D/A-conversion constitutes the correction signal.

The invention exhibits, above solving the above stated problem, the following advantages. Pro primo, the solution offered to the problem of the invention is comparatively simple and provides possibilities for an effective and accurate signal treatment. Secondly the invention uses a error indication signal, which is based on a deviation in the actual frequency slope from a desired frequency slope, which simplifies the control of a linear frequency variation, since the set value information in such a case is independent of time.

PREFERRED EMBODIMENTS

Figure 1:
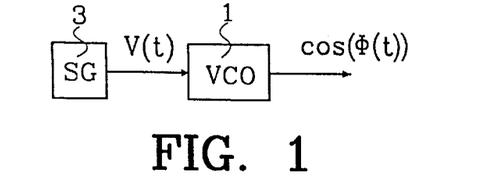
FIG. 1 shows an open control sequence of a voltage controlled oscillator according to prior art.

In FIG. 1 is shown how an open control sequence for a voltage controlled oscillator 1—a VCO—fundamentally may be accomplished according to prior art.

The oscillator 1 in FIG. 1 is controlled by a control signal in the form of a voltage varying with time V(t) and generates, in dependence of the control signal V(t), an oscillator signal $\cos(\phi(t))$. Herein $\phi(t)$ represents the phase of the oscillator signal $\cos(\phi(t))$. The control signal V(t) is generated by a control signal generator 3.

The frequency f(t) of the oscillator signal $\cos(\phi(t))$ and the frequency slope $\mu(t)$—being variables, which will be used below are defined by the relationships below $$f(t) \equiv \frac{\dot{\phi}(t)}{2\pi} \tag{1}$$

$$\mu(t) \equiv \dot{f}(t) = \frac{\ddot{\phi}(t)}{2\pi} \tag{2}$$

The dots designate, as is common usage, derivation in respect of time.

The oscillator signal $\cos(\phi(t))$ frequency f(t) is dependent on the control signal V(t), and as is mentioned above the need often arises of controlling the oscillator 1 in such a manner that its frequency f(t) varies with time in some specific desired manner.

Figure 3:
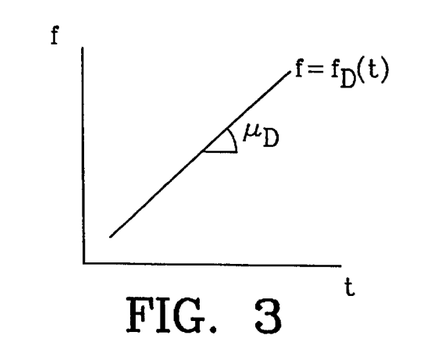
FIG. 3 shows a curve exemplifying a desired frequency variation from a voltage controlled oscillator.

In FIG. 3 is shown, schematically, one example of such a desired frequency variation $f_D(t)$. As shown, it is the desire that the frequency f(t) should vary linearly with respect to time, of which of course follows, that the desired frequency slope is a constant value $\mu_0$.

Figure 2:
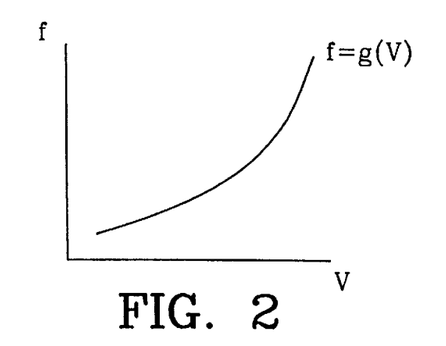
FIG. 2 shows a curve exemplifying a correlation between the frequency and the control voltage in a voltage controlled oscillator.

In FIG. 2 is shown, schematically, the correlation between the control signal V and the oscillator signal frequency f. For an ideal oscillator this correlation should have been totally linear. The oscillator 1 in FIG. 1 is, however, no ideal oscillator, and the correlation which is shown in FIG. 2 is not linear. This poses some problems, as the oscillator 1 must be fed a control signal V(t), which will give the desired frequency variation $f_D(t)$.

Figure 4:
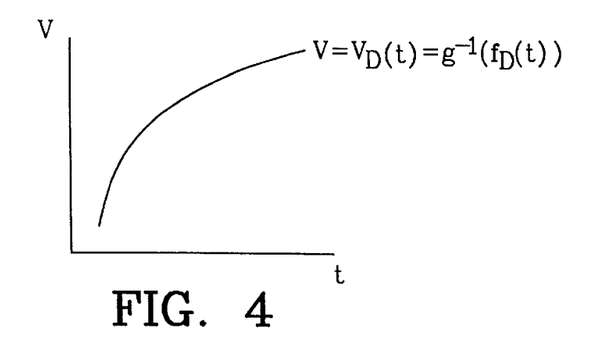
FIG. 4 shows a curve exemplifying how the control voltage should vary with time in order to give a desired frequency variation from the voltage controlled oscillator.

In FIG. 4 is shown, schematically, the control signal $V_D(t)$ which gives the desired $f_D(t)$. The control signal $V_D(t)$ becomes rather complicated as it, as indicated in FIG. 4, must be generated both with respect to the desired frequency variations $f_D(t)$ and the correlation between the control signal V and the frequency f of the oscillator 1.

Figure 5:
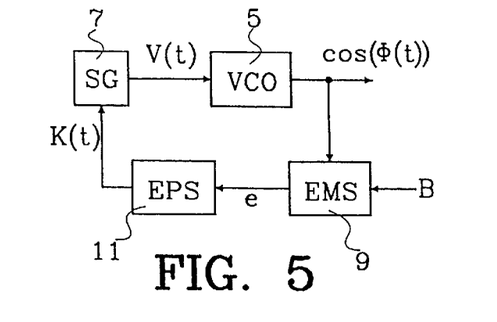
FIG. 5 shows a closed control sequence of a voltage controlled oscillator according to prior art.

The correlation between the control signal V and the frequency f is influenced, as already mentioned, by the ambient temperature. This makes it hard to, with good precision, perform an open control sequence of a VCO, which usually leads to the use of some type of closed control sequence. In FIG. 5 is shown, in accordance with prior art how such a control sequence fundamentally may be performed.

In FIG. 5 is shown how a voltage controlled oscillator 5 is fed a control signal in the form of a voltage V(t). The control voltage V(t) is generated by a control signal generator 7, which generator also recieves a correction signal K(t). The control signal generator 7 modifies the control signal V(t) in dependence of the received correction signal K(t) in order to make the oscillator signal frequency vary with time in the desired manner $f_D(t)$.

In FIG. 5 the correction signal K(t) is generated in a control loop according to the following.

The oscillator signal $\cos(\phi(t))$ is measured, and an error measuring system 9 generates a error indication signal e in dependence of the measured oscillator signal $\cos(\phi(t))$. The error indication signal e, in FIG. 5, indicates the deviation of in the oscillator signal $\cos(\phi(t))$ of the frequency slope $\mu(t)$ from the desired frequency slope $\mu_D$. In FIG. 5 the information about the desired frequency slope $\mu_D$ may be found in a set value B, which is supplied to the error measuring system 9.

There is also a possibility to use an error indication signal which indicates the deviation from a desired phase $\phi(t)$ or a desired frequency $f_D(t)$.

In FIG. 5 may further be seen, that a error processing system 11 generates the correction signal K(t) in dependence of the error indication signal e. The error processing system 11 may be realised in different ways. The error processing system 11 may in its simplest form more or less directly transfer the error indication signal e as a correction signal K(t) to the signal generator 7. A more advanced error processing system 11 may be adaptive, whereby the system can store data such that the system for each time the generation of the desired frequency variation $f_D(t)$ is attempted it will succeed better by using the data from earlier attempts.

The present invention will now be described with reference to FIGS. 6 to 9.

Figure 6:
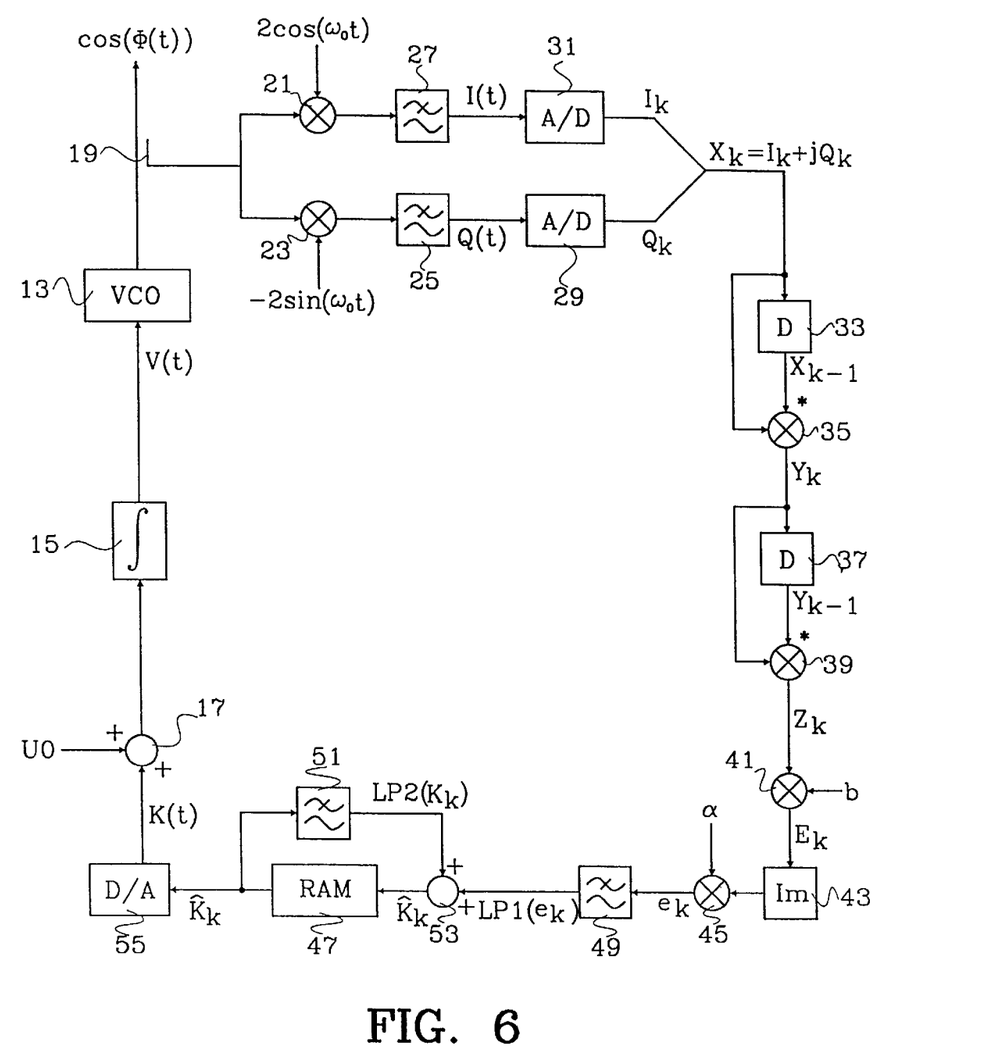
FIG. 6 shows a block diagram illustrating one embodiment of the control sequence of a voltage controlled oscillator according to the present invention.

In FIG. 6 a block diagram discloses a closed and adaptive control sequence of the frequency f(t) of a oscillator signal $\cos(\phi(t))$ a voltage controlled oscillator 13 in accordance with the present invention. The block diagram in FIG. 6 shall in the first place be seen as descriptive of the methodological build up of the invention, even though the block diagram naturally in some parts may be considered to indicate possible constructive solutions.

In FIG. 6 the voltage controlled oscillator 13 receives a control signal in the form of a varying voltage V(t). The oscillator 13 generates an oscillator signal $\cos(\phi(t))$; the frequency f(t) of which is dependent on the received control signal V(t).

In FIG. 6 the control signal V(t) is generated by adding a voltage U0 (17) to a correction signal K(t), whereby the, by the addition received, cumulative signal sum is integrated 15. The result of the integration 15 is fed to the oscillator 13 as the control signal V(t). The control signal V(t) is thus constantly modified at all times in dependence of the correction signal K(t). The voltage U0 determines the nominal slope of the control signal V(t), and the value of U0 is chosen, such that the control signal nominal slope assumes a suitable value.

Figure 7:
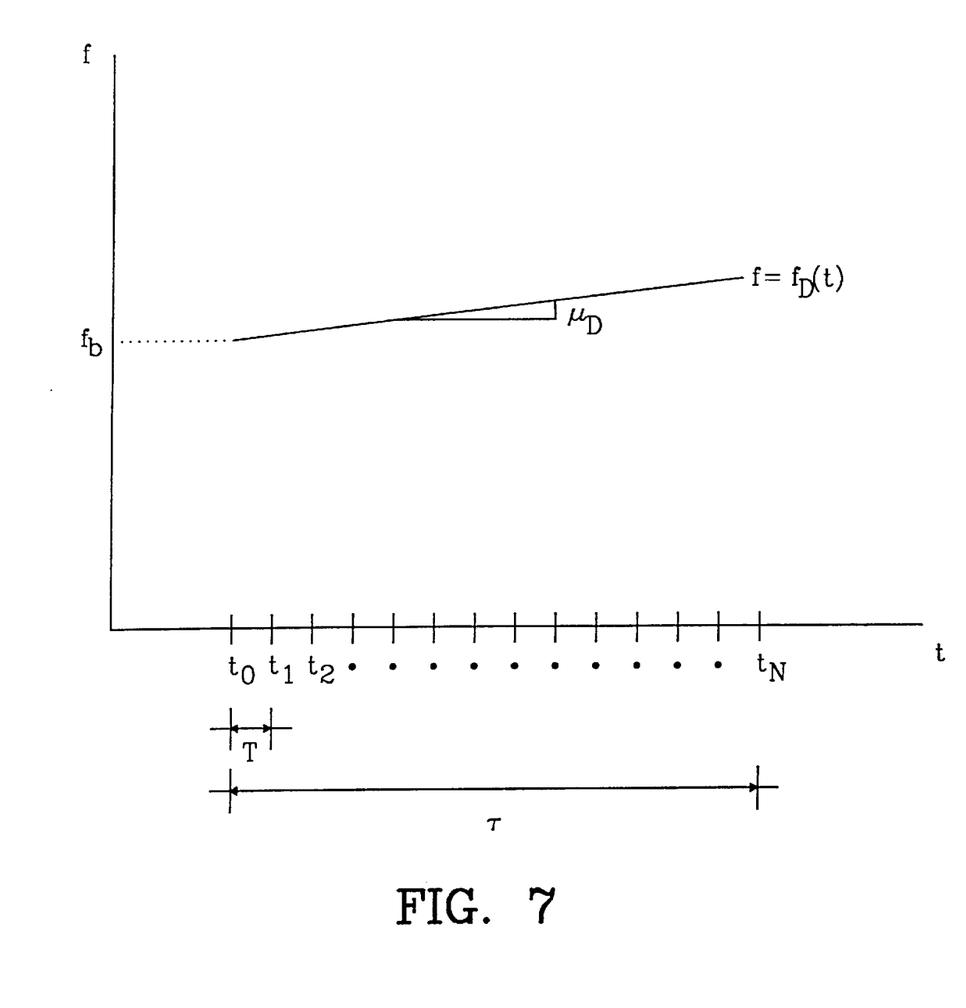
FIG. 7 shows an example of a desired frequency variation from a voltage controlled oscillator according to the present invention.

In FIG. 7 is shown the desired frequency variation $f_D(t)$. The frequency f(t) of the oscillator 13 is to be controlled such that it varies linearly with time under a time period $\tau$. The desired linear frequency variation corresponds $f_D(t)$ to a desired frequency slope $\mu_D$.

Sometimes the desired frequency variation may be such, that it comprises several time periods during which the frequency shall vary linearly with respect to time, whereby the desired frequency slope corresponding to the different time periods may be different. The present invention can, under such circumstances, naturally be used to control the frequency variations for a optional number of these time periods.

In the embodiment according to FIG. 6 the correction signal K(t) thus shall be so generated that the control signal V(t) is modified in such a way that the desired frequency variation $f_D(t)$ is accomplished. The generation of the correction signal is done in a control loop shown i FIG. 6 which is described below.

The control loop in FIG. 6 starts with a quadrature demodulation of the oscillator signal $(\cos(\phi(t))$. In the quadrature demodulation of the oscillator signal $\cos(\phi(t))$ a first quadrature signal (I(t)) (the in-phase signal) and a second quadrature signal Q(t) (the quadrature phase signal) are generated. The phase displacement of the two quadrature signals I(t) and Q(t) are separated by $\pi/2$.

The quadrature demodulation in FIG. 6 begins by measuring the oscillator signal $\cos(\phi(t))$. In FIG. 6 is indicated that the measurement is performed by means of a coupler 19, but the measurement may of course be performed by other means.

The quadrature demodulation of the oscillator signal $\cos(\phi(t))$ in FIG. 6 continues in that the oscillator signal $\cos(\phi(t))$ is separated into a first part and a second part, the first part and the second part being of equal size.

The in-phase signal I(t) is generated by multiplying 21 the first part of the measured oscillator signal $\cos(\phi(t))$ with a first harmonically oscillating signal $2\cos(\omega_0 t)$ whereat the result of the multiplication 21 is lowpass filtered 27. The first harmonically oscillating signal $2\cos(\omega_0 t)$ oscillates with a constant frequency $\omega_0/2\pi$.

The quadrature phase signal Q(t) is generated in a similar manner by multiplying 23 the second part of the measured oscillator signal $\cos(\phi(t))$ with a second harmonically oscillating signal $-2\sin(\omega_0 t)$ whereat the result of the multiplication is lowpass filtered 25. The second harmonically oscillating signal $-2\sin(\omega_0 t)$ exhibits the same peak values and same frequency as the first harmonically oscillating signal $2\cos(\omega_0 t)$; the phase of the second harmonically oscillating signal $-2\sin(\omega_0 t)$ lies however $\pi/2$ ahead of the phase of the first harmonically oscillating signal $2\cos(\omega_0 t)$.

In FIG. 6 the first and the second harmonically oscillating signals are indicated as $2\cos(\omega_0 t)$ and $-2\sin(\omega_0 t)$. The peak value two and the absolute phase displacement have been chosen in order to simplify the description, and these choices should not be understood as indicative of the limitations of the invention.

In FIG. 7 the desired frequency variation $f_D(t)$ on a relatively high basic level $f_b$. The changes in the frequency f(t) of the oscillator signal $\cos(\phi(t))$ which arises during the control sequence are small as compared to this basic level $f_b$. The frequency $\omega_0/2\pi$ of the first and the second harmonically oscillating signal $2\cos(\omega_0 t)$ and $-2\sin(\omega_0 t)$ has been chosen such that it is of the same order as the basic level $f_b$. Against this background it has become practical to reformulate the oscillator signal phase accordingly $$\phi(t) = \omega_0 t + \theta(t) \qquad (3)$$

This introduces a secondary phase $\theta(t)$. For this secondary phase the frequency $\theta(t)/2\pi$ corresponding to the secondary phase $\theta(t)$ equals the difference between the oscillator frequency f(t) and the constant frequency $\omega_0/2\pi$ of the first and the second harmonically oscillating signal $2\cos(\omega_0 t)$ and $-2\sin(\omega_0 t)$. It is immediately evident that $$\theta(t)=\phi(t) \qquad (4)$$

Accordingly to what was said previously the following must also be valid $$|\dot{\theta}(t)|<<\omega_0 \qquad (5)$$

When the first part of the measured oscillator signal $\cos(\theta(t))$ is multiplied 21 with the first harmonic oscillating signal $2\cos(\omega_0 t)$ the following is given, using the equation (3), $$2\cos(\omega_0 t)\cos(\omega_0 t+\theta)=\cos(\theta)+\cos(\theta)\cos(2\omega_0 t)-\sin(\theta)\sin(2\omega_0 t) \qquad (6)$$

When the second part of the measured oscillator signal $\cos(\theta(t))$ is multiplied 23 with the second harmonic oscillating signal $-2\sin(\omega_0 t)$ the following is correspondingly given $$-2\sin(\omega_0 t)\cos(\omega_0 t+\theta)=\sin(\theta)-\cos(\theta)\sin(2\omega_0 t)-\sin(\theta)\cos(2\omega_0 t) \qquad (7)$$

When lowpass filtering 25 and 27 the signals according to the equations (6) and (7) the fastes varying terms are filtered off, and essentially only the first terms in the right side of the equations (6) and (7) will remain. The in-phase signal I(t) and the quadrature phase signal Q(t) can thus be written $$I(t)=\cos(\theta(t)) \qquad (8)$$

$$Q(t)=\sin(\theta(t)) \qquad (9)$$

The phase of the in-phase signal I(t) is, as can be seen, the secondary phase $\theta(t)$. The in-phase signal I(t) and the quadrature phase signal Q(t) exhibit the same frequency, but the phase of the quadrature phase signal Q(t) is separated by $\pi/2$ from the phase of the in-phase signal I(t).

The control loop in FIG. 6 continues with A/D-conversion of the in-phase signal I(t) and of the quadrature phase signal Q(t) 31 and 29.

The A/D-conversion 31 and 29 occurs successively at a number of points of time $t_k$; k=0, 1, , . . . , N during the time period $\tau$ during which the control sequence of the oscillator frequency f(t) is intended to be performed. In FIG. 7 some of the points of time $t_k$ are indicated. From FIG. 7 is evident that that the first time position $t_0$ essentially coincides with the start of the time period $\tau$ and that the last point of time $t_N$ essentially coincides with the end of the time period $\tau$. From FIG. 7 also is evident that the time difference between two consecutive points of time, of the in FIG. 6 shown embodiment, is a constant time interval T.

In the description below a number of time discrete signals are told of; when referring to these time discrete signals the subscript k is used and when referring to any signal value of these time discrete signals the subscript n or some other subscript is used.

The A/D-conversion 31 of the in-phase signal I(t) gives rise to a time discrete in-phase signal $I_k$; k=0, 1, . . . , N being generated and in the corresponding manner the A/D-conversion of the quadrature phase signal Q(t) gives rise to a time discrete quadrature phase signal $Q_k$; k=0, 1, . . . , N being generated. Using the equations (8) and (9) one will find that at a given point of time $t_n$ the signal value $I_n$ of the time discrete in-phase signal and the signal value $Q_n$ of the time discrete quadrature phase signal corresponding to the point of time $t_n$ may be written $$I_n=\cos(\theta_n) \qquad (10)$$

$$Q_n=\sin(\theta_n) \qquad (11)$$

where $$\theta_n \equiv \theta(t_n) \qquad (12)$$

At a given point of time $t_n$ the signal value $I_n$ of the time discrete in-phase signal in combination with the signal value $Q_n$ of the time discrete quadrature phase signal constitute a representation of the secondary phase $\theta_n$ at the point of time $t_n$. That the two signal values $I_n$ and $Q_n$ constitute a representation of the secondary phase $\theta_n$ is here taken to mean that the secondary phase $\theta_n$ may be calculated directly (except for an arbitrary multiple of $2\pi$) from the signal values $I_n$ and $Q_n$.

The quadrature demodulation of the measured oscillator signal $\cos(\phi(t))$ thus renders a double profit; on one hand signals I(t) and Q(t) with slower variations with time are obtained, which simplifies the A/D-conversions 31 and 29, and on the other hand a direct representation of the secondary phase $\theta_n$ is obtained.

In FIG. 6 the control loop continues by generating a first time discrete complex signal $X_k$; k=0, 1, . . ., N. Corresponding to a given point of time $t_n$ the signal value $X_n$ is generated, such that its real part corresponds to the signal value $I_n$ of the first time discrete in-phase signal corresponding to the point of time $t_n$, and such that its imaginary part corresponds to the signal value $Q_n$ of the time discrete quadrature phase signal corresponding to the point of time $t_n$, i.e.

$$X_n \equiv I_n + jQ_n = e^{j\theta_n} \qquad (13)$$

Above j symbolises the imaginary unit.

The control loop in FIG. 6 continues by generating a time discrete differential signal $Y_k$; k=0, 1, . . . , N. Corresponding to a given point of time tn the signal signal value $Y_n$ of the time discrete differential signal is generated, such that it corresponds to the value of a multiplication 35 of the signal value $X_n$ of first time discrete complex signal, corresponding to the point of time $t_n$, and the signal value $X^*_{n-1}$ of the complex conjugate of the first time discrete complex signal at the immediately preceding point of time $t_{n-1}$. The * signifies the complex conjugation.

In FIG. 6 is indicated that in generation of the time discrete differential signal $Y_k$ a first delay block 33 is used. This should be understood such, that at a given point of time $t_n$ the signal value $X_{n-1}$ of the first time discrete complex signal corresponding to the last preceding point of time $t_{n-1}$ has been delayed, e.g. by being stored in a memory. The stored signal value $X_{n-1}$ is complex conjugated and multiplied 35 with the first time discrete complex signal's recently generated signal value $X_n$. After the multiplication 35 the new signal value $X_n$ is stored and is thus delayed such that it may be used at the next point of time $t_{n+1}$. The first delay block 33 indicates in this case that the signal value $X_n$ preferably is stored in the memory space where the signal value $X_{n-1}$ previously was stored.

As regards the generation of the signal value $Y_0$ of the time discrete differential signal corresponding to the first point of time $t_0$ there is no earlier signal value $X_{-1}$ to use, as such a signal value never has been generated. $X_{-1}$ is therefore a predetermined starting value. In the embodiment depicted in FIG. 6 this starting value $X_{-1}$ has been set to zero. The starting value $X_{-1}$ is thus stored in the memory space indicated by the first delay block 33 already when the control sequence is begun. The starting value $X_{-1}$ is of course only a fictive auxiliary value corresponding to a likewise fictive auxiliary point of time $t_{-1}$.

Accordingly the signal value $Y_n$ of the time discrete differential signal corresponding to a given point of time $t_n$ may be written $$Y_n \equiv X_n X'_{n-1} = e^{j(\theta_n - \theta_{n-1})} = e^{j\Delta^-\theta_n} \quad (14)$$

In the above equation a difference operator $\Delta^-$ has been introduced, which here designates the back-difference according to $$\Delta^-\theta_n \equiv \theta_n - \theta_{n-1} \quad (15)$$

The control loop in FIG. 6 continues by generating a time discrete approximation signal $Z_k$; k=0, 1, . . . , N. Corresponding to a given point of time $t_n$ the signal value $Z_n$ of the time discrete approximation signal is generated such that it corresponds to the value of a multiplication 39 between the signal value $Y_n$ of the time discrete differential signal corresponding to the point of time $t_n$ and the signal value $Y'_{n-1}$, of the complex conjugate of the time discrete differential signal corresponding to the immediately preceding point of time $t_{n-1}$.

In FIG. 6 is indicated that in the generation av the time discrete approximation signal $Z_k$ a second delay block 37 is used. This should be interpreted in the same manner as for the first delay block 33.

As regards the generation of the signal value $Z_0$ of the time discrete difference signal corresponding to the first point of time $t_0$ there is no earlier signal value $Y_{-1}$ to use, as such a signal value never has been generated. $Y_{-1}$ is therefore a predetermined starting value. In the embodiment depicted in FIG. 6 this starting value $Y_{-1}$ has been set to zero. The starting value is thus stored in the memory space indicated by the first delay block 33 already when the control sequence is begun. The starting value $Y_{-1}$ is of course only a fictive auxiliary value corresponding to a likewise fictive auxiliary point of time $t_{-1}$.

Accordingly the signal value $Z_n$ of the time discrete difference signal corresponding to a given point of time $t_n$ may be written $$Z_n \equiv Y_n Y'_{n-1} = e^{j(\Delta^-\theta_n - \Delta^-\theta_{n-1})} = e^{j\Delta^-(\Delta^-\theta_n)} = e^{j(\Delta^-)^2\theta_n} \quad (16)$$

The time discrete approximation signal $Z_k$ gives information about the actual frequency slope $\mu(t)$ of the oscillator signal $\cos(\phi(t))$, exactly how this is accomplished will be thoroughly explained further below in the description.

The control loop in FIG. 6 continues by generating another time discrete complex signal $E_k$; k=0,1, . . . , N. The signal value $E_n$ of the second time discrete complex signal corresponding to a given point of time $t_n$ is generated such that it correspond to the value of a multiplication 41 between the signal value $Z_n$ of the time discrete approximation signal corresponding to the point of time $t_n$ and a complex set value $b = e^{-j2\pi T^2 \mu_D}$. From this follows that the signal value $E_n$ of the second time discrete complex signal corresponding to a given point of time may be written $$E_n = Z_n b = e^{j((\Delta^-)^2\theta_n - 2\pi T^2\mu_D)} \quad (17)$$

In FIG. 6 the control loop continues by generating a time discrete error indication signal $e_k$; k=0,1, . . . , N. The signal value $e_n$ of the time discrete error indication signal corresponding to a given point of time $t_n$ is generated such that it corresponds to the value of the multiplication 45 between the imaginary part $Im\{E_n\}$ 43 of the signal value $E_n$ of the second time discrete complex signal corresponding to the point of time $t_n$ and a real loop constant $\alpha$. The signal value $e_n$ of the time discrete error indication signal corresponding to a given point of time $t_n$ can thus be written $$e_n \equiv \alpha Im\{E_n\} = \alpha \sin((\Delta^-)^2\theta_n - 2\pi T^2\mu_D) \quad (18)$$

The loop constant $\alpha$ has been introduce on account of the non-linearity of the oscillator characteristics. The loop constant $\alpha$ is needed to stabilise the control loop. The value of the loop constant $\alpha$ is determined essentially by the oscillator 13 maximum frequency amplification, a fact which is well-known in the art.

Using the approximations $$\frac{(\Delta^-)^2\theta_n}{T^2} \approx \ddot{\theta}(t_n),$$

and $\sin(x) \approx x$, (when x is small) it is further found that $$\alpha\sin((\Delta^-)^2\theta_n - 2\pi T^2\mu_D) \approx \alpha(T^2\ddot{\theta}(t_n) - 2\pi T^2\mu_D) = 2\pi\alpha T^2(\mu(t_n) - \mu_D \quad (19)$$

The signal value $e_n$ of the time discrete error signal indicates, as is shown, the deviation in the frequency slope $\mu(t_n)$ in the oscillator signal $\cos(\phi(t))$ at the given time position $t_n$ from the desired frequency slope $\mu_D$.

The control sequence of the oscillator 13 in FIG. 6 is adaptive. This means that there are stored correction values $K_k$; k=0,1, . . . , N corresponding to each one of the points of time $t_k$. The correction values $K_k$ are stored in a memory, and in FIG. 6 is indicated that this memory for example comprises a RAM-memory 47.

If it is the first time the control sequence of the frequency variations f(t) is run, the stored correction values $K_k$, are when the control sequence starts set to predetermined start values, they may e.g. be set to zero.

If it is not the first time the control sequence is run of the frequency variations f(t), then the stored corrections values $K_k$, when the control sequence starts, has values which adaptively have been improved during earlier control sequences of the frequency variations f(t) of the oscillator 13. How the adaptive improvement of the stored corrections values $K_k$ is done will be understood from the description below.

In FIG. 6 the control sequence is continued by the correction signal K(t) being generated. The correction signal K(t) is generated in dependence of on the one hand the time discrete error signal $e_k$, and on the other hand the stored correction values $K_k$.

In order to generate the correction signal K(t) a first time discrete low pass signal $LP1(e_k)$; k=0,1, . . . , N and a second time discrete low pass signal $LP2(K_k)$; k=0,1, . . . , N are generated.

The signal value LP1($e_n$) of the first time discrete low pass signal corresponding to a given point of time $t_n$ is generated by a time discrete lowpass filtering 49 of the time discrete error indication signal $e_k$ at the given point of time $t_n$.

The lowpass filtering 49 of the time discrete error indication signal $e_k$ comprised in FIG. 6 may be a FIR-filtering (Finite Impulse Response filter) corresponding to a first time discrete impuls response function $^1h_k$; k=0,1, ... m1. The signal value LP1($e_n$) of the first time discrete lowpass signal, corresponding to a given point of time $t_n$, may in such a case be written $$LP1(e_n) = \sum_{i=0}^{\min(n,m1)} {}^1h_i e_{n-i} \quad (20)$$

The signal value LP2($K_n$) of the second time discrete lowpass signal corresponding to a given point of time $t_n$ is generated by a time discrete lowpass filtering 51 of the stored correction values $K_k$ at the given point of time $t_n$—the stored correction values $K_k$ is naturally understood in this connection as a stored time discrete signal.

The lowpass filtering 51 of the stored correction values $K_k$ is in FIG. 6, e.g. a FIR-filtering corresponding to a second time discrete impulse response function $^2h_k$; k=−m2, −m2+1, ..., m3−1, m3. The signal value LP2($K_n$) of the second time discrete lowpass signal, corresponding to a given point of time $t_n$, may in such a case be written $$LP2(K_n) = \sum_{i=\max(n-N,-m2)}^{\min(n,m3)} {}^2h_i K_{n-i} \quad (21)$$

How the two time discrete impuls response functions $^1h_k$ and $^2h_k$ should be chosen in order to achieve the lowpass filtering effect is a fact known to the man skilled in the art.

The lowpass filtering 49 which is used in generating the first time discrete lowpass signal LP1($e_k$) i. a. a causal FIR-filtering. The reason for this is that the filtering must be done in real time. As to the generation of the second lowpass signal LP($K_k$) there is no claim that the filtering 51 should be such that it works in real time, since the stored correction values $K_k$ corresponding to all points of time $t_k$ already are available. The lowpass filtering 51 of the second time discrete lowpass signal LP2($K_k$) may therefore be a non-causal FIR-filtering, as is indicated in the equation (21).

When it comes to the generation of the second time discrete lowpass signal LP2($K_k$) one may, of course, use other types of lowpass filtering 51, which are not usable in real time, e.g. a FFT-based filtering (Fast Fourier Transform).

Corresponding to a given point of time $t_n$ a new correction value $\hat{K}_n$ is generated i FIG. 6. The new correction value $\hat{K}_n$ corresponding the point of time $t_n$ is generated such that it equals the value of an addition 53 of the first time discrete lowpass signal value LP1($e_n$) and the second time discrete lowpass signal value LP2($K_n$) corresponding to the point of time $t_n$. That is $$\hat{K}_n = LP1(e_n) + LP2(K_n) \quad (22)$$

In FIG. 6 the new correction value $\hat{K}_n$, corresponding to a given point of time $t_n$ are stored in the memory space in the RAM-memory where the stored correction values $K_n$ corresponding to the point of time is stored. The stored correction value $K_n$ is overwritten by the new correction value $\hat{K}_n$, which should be understood such that the stored correction value $K_n$ corresponding to the time position $t_n$ is changed to the new correction value $\hat{K}_n$.

The new correction values $\hat{K}_k$ (k=0,1, ... , N) are succesively D/A-converted 55. The result of the D/A-conversion 55 in FIG. 6 constitutes the correction signal K(t).

In the above description all of the control loop has been described. The functional mode of the invention will now be explained in more detail and generalised.

In the control loop the time discrete error indication signal $e_k$ is generated. The time discrete error indication signal $e_k$ indicates the deviation of the real frequency slope $\mu(t_k)$ of the osillator signal from the desired frequency slope $\mu_D$.

The new correction values $\hat{K}_k$ are generated in dependence of the time discrete error indication signal $e_k$ and the stored correction values $K_k$. In generating the new correction values $\hat{K}_k$, time discrete lowpass filterings 49 and 51 are performed of the time discrete error indication signal $e_k$ and the stored correction values $K_k$. The reason for having to perform these lowpass filterings 49 and 51 lies in the stability characteristics of the control loop. As is well-known to the man skilled in the art, the stability characteristics of a control loop depends generally on the loop bandwidth and the loop amplification. In generating the time discrete error indication signals $e_k$, two delays are used, indicated by the two delay blocks 33 and 37. This gives rise to a specific stability problem.

On account of the two delays 33 and 37 and the fact that there are always components in the control loop which generate noise, more noise would be generated for each round in the control loop than was being removed therefrom, and this would also be true even if the time discrete error indication signal $e_k$ was forcefully lowpass filtered. The result is that the stored corrections values $K_k$ would contain more noise for each turn of the control loop. In order to get around this, two lowpass filterings 49 and 51 are performed and the noise is thereby restricted, and the control loop stabilised.

The correction signal K(t) is generated by an D/A-conversion 55 of the new correction signal $\hat{K}_k$. The control signal V(t) is generated in dependence of the correction signal K(t). In the manner (shown in FIG. 6) in which the control signal V(t) is generated, the correction signal K(t) will influence the slope of the control signal V(t). Generation of the control signal V(t) may, however, be performed in other ways. The correction signal K(t) could, e.g., be added after the integration 15, the correction signal would then act directly on the value of the control signal V(t). The generation of the control signal V(t) in dependence of the correction signal K(t) may of course be performed according to any other know manner.

The manner in which the invention generates the time discrete error indication signal $e_k$ deserves further attention. The signal value $Z_n$ of the time discrete approximation signal, corresponding to a given point of time $t_n$, represents as may be seen from the equation (16), a second difference $(\Delta^-)^2\theta_n$ and may thus be said to represent an approximation $$\frac{(\Delta^-)^2\theta_n}{T^2}$$

of the second derivative of the secondary phase in respect of time $\theta(t_n)$ at the point of time $t_n$. The term time discrete approximation signal signifies here generally a time discrete signal, the signal value of which corresponding to a given point of time $t_n$ represents an approximation of the secondary phase second time derivative $\ddot\theta(t_n)$ at the given point of time $t_n$.

The secondary phase θ(t) second time derivative θ̈(t) is equal to the second derivative with respect to time φ(t) of the phase of the oscillator signal φ(t). The second derivative with respect to time φ(t) of the phase of the oscillator signal φ(t) is related, according to the equation (2), directly to the frequency slope $\mu(t)$ of the oscillator signal cos(φ(t)). The signal value $Z_n$ of the time discrete approximation signal at a given point of time $t_n$, thus establishes the frequency slope $\mu(t_n)$ of the oscillator signal cos(φ(t)) at the given point of time $t_n$. When the information about the oscillator signal frequency slope $\mu(t)$ thus has been acquired via the time discrete approximation signal $Z_k$, then having knowledge of the desired frequency slope $\mu_D$, it is simple to generate the time discrete error indication signal $e_k$ in dependence of the time discrete approximation signal $Z_k$.

The time discrete approximation signal $Z_k$ is generated in dependence of the time discrete in-phase signal $I_k$ and the time discrete quadrature phase signal $Q_k$. In FIG. 6 this is done by first generating the time discrete differential signal $Y_k$. The time discrete difference signal $Y_k$ is such that the signal value $Y_n$ of the same, corresponding to a given point of time $t_n$, represents a difference $\Delta^-\theta_n$ between the secondary phase $\theta_n$ at the given point of time $t_n$ and the secondary phase $\theta_{n-1}$ at the immediately preceding point of time $t_{n-1}$, which most easily may be seen by looking at the equations (14). The time discrete approximation signal $Z_k$ may then be generated in dependence of the time discrete difference signal $Y_k$.

The method according to which the approximation signal $Z_k$, in FIG. 6, is generated in dependence of the time discrete in-phase signal $I_k$, and the time discrete quadrature phase signal $Q_k$ is a preferred method. The invention should, however, not be viewed as being limited to this method of generating the approximation signal $Z_k$ in dependence of the time discrete in-phase signal $I_k$, and the time discrete quadrature phase signal $Q_k$, the generation of said signal may of course be performed by some other method.

One further such method is to calculate the secondary phase $\theta_k$ at the points of time $t_k$ from the representation of the secondary phase θ, which is given by the time discrete in-phase signal $I_k$ and the time discrete quadrature phase signal $Q_k$. In such a calculation it should be remembered that the secondary phase θ(t), as defined here is derivable and continuous with respect to time. A man skilled in the art, however, has no problem to construct a calculation algorithm for the calculation of the secondary phase $\theta_k$ at the points of time $t_k$, which is consistent with the definition of the secondary phase θ.

When the secondary phase $\theta_k$ has been calculated for different points of time $t_k$ it is a simple task to, from theses calculations, determine an approximation of the secondary phase second time derivative θ̈($t_n$) for different points of time $t_n$. This may e.g. be performed in a way similar to the one in FIG. 6, through a direct generation of a time discrete signal of first differences $\Delta^-\theta_k$; k=0,1, . . . , N through a direct generation of a time discrete signal of second differences $(\Delta^-)^2\theta_k$; k=0,1, . . . , N in dependence of the time discrete signal of first differences $\Delta^-\theta_k$. The time discrete signal of second differences $(\Delta^-)^2\theta_k$ k are in this respect preferably used as time discrete approximation signal $Z_k$.

The approximations to the secondary phase second derivative in respect of time θ̈(t) may of course be calculated from the calculations of the secondary phase $\theta_k$ at different points of time $t_k$, in a more sophisticated manner—here is referred to the mathematical literature, e.g. the theory of series expansion.

The manner, according to the present invention, in which the frequency slope $\mu(t)$ is determined—i.e. the forming of a time discrete approximation signal $Z_k$—may of course be used in other contexts where a wish exists to determine the frequency slope $\mu(t)$ of an oscillator signal, e.g. in other methods for controlling a controllable oscillator.

The method which is illustrated in FIG. 6 may with certain modifications be used in controlling a controllable oscillator when the desired frequency variation $f_D(t)$ is non-linear. In such a case, the desired frequency slope $\mu_D(t)$ will vary in respect of time, which will have the result that the set value information, which is used in the control sequence also must vary with time. Thus, in order to use the method in FIG. 6 a time discrete complex set value signal $b_k = e^{-j2\pi T2\mu_D(tk)}$ corresponding to the different points of time $t_k$, instead of the complex set value b—in other respects the method may be used unchanged. As the set value information varies with time higher demands are made on the time accuracy and the precision of the system.

Figure 8:
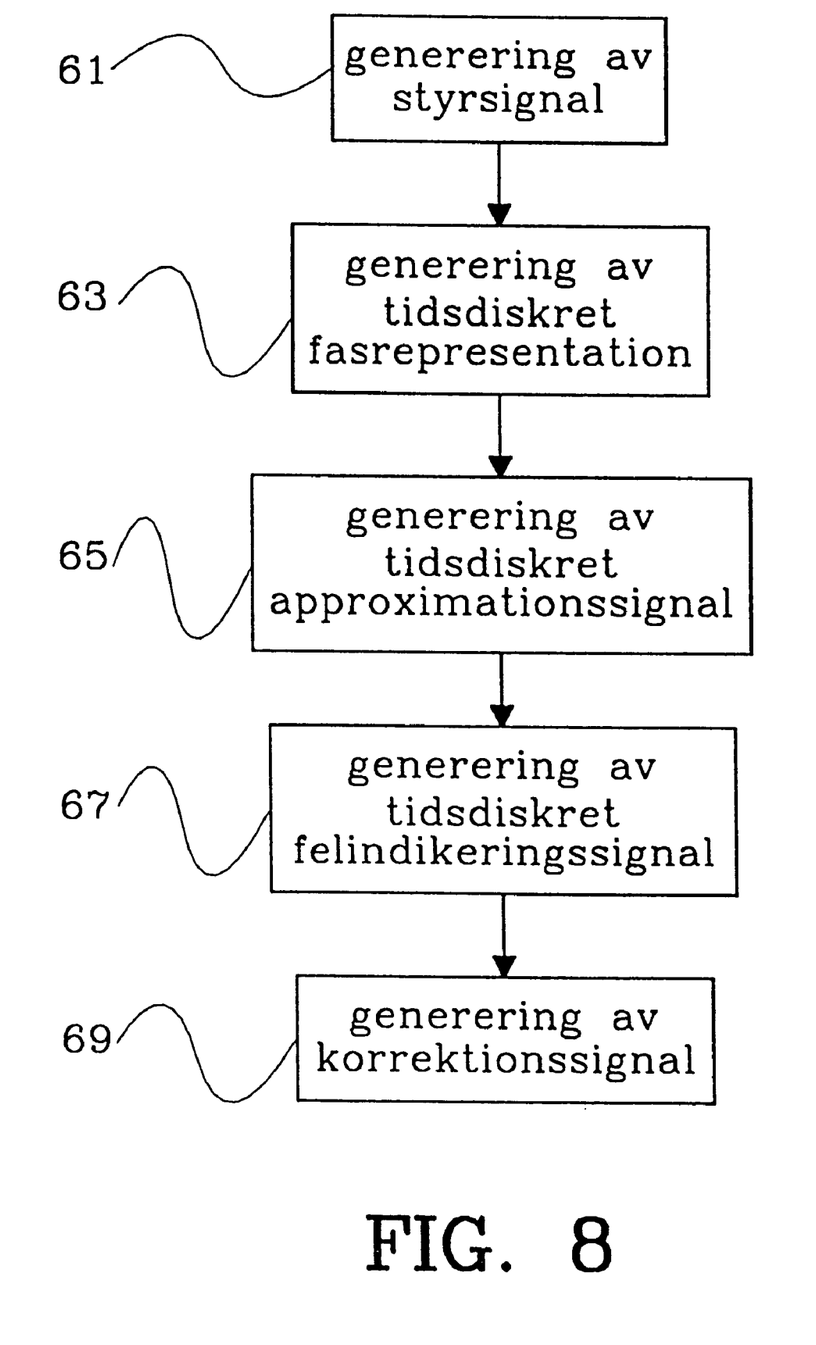
FIG. 8 shows a flowchart summarising the method steps involved in the control of a controllable oscillator according to the present invention.

In FIG. 8 the method steps involved in the control sequence according to FIG. 6 are summarise from a general point of view.

The first step 61 in FIG. 8 is the generation of a control signal V(t) for the control of the controllable oscillator 13.

The second step 63 in FIG. 8 is the generation of a time discrete representation $I_k$ and $Q_k$ of a secondary phase θ(t) from an oscillator signal cos(φ (t)). For the secondary phase θ(t) it shall be valid that the frequency θ̇(t)/2π corresponding to the secondary phase θ(t) is equal to the difference between the oscillator signal frequency f(t) and a constant frequency $\omega_G/2\pi$.

The third step 65 in FIG. 8 is the generation of a time discrete approximation signal $Z_k$ in dependence of the time discrete representation $I_k$ and $Q_k$ of the secondary phase θ(t). The time discrete approximation signal $Z_k$ is here generated such that it gives information about the real frequency slope $\mu(t)$ of the oscillator signal cos(φ(t)).

The fourth step 67 in FIG. 8 is the generation of a time discrete error indication signal $e_k$ in dependence of the time discrete approximation signal $Z_k$. The time discrete error indication signal $e_k$ is here generated, such that it indicates the difference between the real $\mu(t)$ and the desired $\mu_D$ frequency slope of the oscillator signal cos(φ (t)).

The fifth step 69 in FIG. 8 is the generation of the correction signal K(t) in dependence of the time discrete error indication signal $e_k$. The correction signal K(t) is used to modify the control signal V(t)

Figure 9:
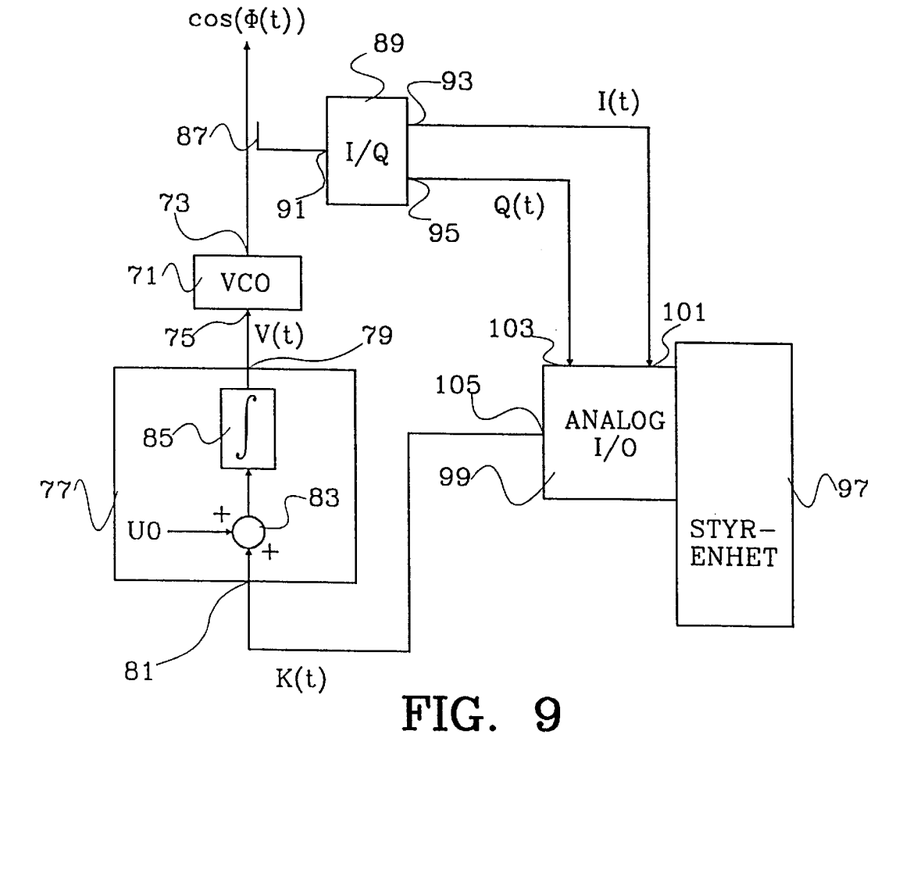
FIG. 9 shows a device for generating an oscillator signal having a predetermined frequency variation according to the present invention.

In FIG. 9 a device is shown for generation of an oscillator signal having a predetermined frequency variation $f_D(t)$. The device in FIG. 9 may be used for generating under a time period τ, one in respect of time linear frequency variation, and the control method according to the invention may preferably be used in this device.

The device shown in FIG. 9 comprises a controllable oscillator 71, and in FIG. 9 this oscillator 71 is a VCO. The controllable oscillator comprises a control signal input 75, through which the controllable oscillator 71 receives a control signal V(t), and an oscillator signal output 73, through which the controllable oscillator 71 emits an oscillator signal cos(φ(t)). The oscillator signal frequency f(t) is here dependent of the control signal V(t).

The control signal V(t) is generated in FIG. 9 by a control signal generator 77. The control signal generator 77 comprises a control signal output 79 and a correction signal input 81. The control signal generator 77 is adapted to emit the control signal V(t) in dependence of a received correction signal K(t), received through a correction signal input 81. The control signal output 79 is connected to the control signal input 75. In the control signal generator 77 the correction signal K(t) and a voltage U0 are fed to the signal inputs of an adder 83. The signal output of the adder 83 is coupled to an integrator 85 and the control signal V(t) is in this case the output signal from the integrator 85. The voltage U0 establishes the nominal slope of the control signal V(t), and the value of the voltage U0 is so chosen that the nominal voltage of the control signal receives an adequate value. This construction of the control signal generator 77 should only be interpreted as one possibility, and the control signal generator 77 may of course be designed in any other possible manner, e.g. in the manner described in the known technology.

The correction signal K(t), which is fed to the control signal generator 77, is generated in FIG. 9 in a control loop as stated below.

The control loop in FIG. 9 comprises means for quadrature demodulation of the oscillator signal cos($\phi$ (t)). A measurement means 87 for measuring of the oscillator signal cos($\phi$(t)) is coupled to the oscillator signal output 73. In FIG. 9 the measurement means 87 is a coupler. A signal input 91 in a quadrature demodulator 89 is coupled to the measurement means 87. The quadrature demodulator 89 is adapted to quadrature demodulate the signal fed to the signal input 91 in respect of a constant frequency $\omega_0/2\pi$ and to emit via a first and second quadrature signal output 93 and 95 an in-phase signal I(t) and a quadrature phase signal Q(t) respectively. The in-phase signal exhibits a secondary phase and the quadrature phase signal Q(t) exhibits a phase that lies $\pi/2$ from the secondary phase $\theta(t)$. The construction of a quadrature demodulator is is known to the man skilled in the art.

The control loop in FIG. 9 further comprises a control unit 97 and one to the control unit coupled analogue indata/outdata-unit 99. The control unit 97 comprises processor means, memory means and clock means. The control unit 97 further comprises program, stored in the memory means, for control of the work of the control unit 97. The indata/outdata-unit 99 comprises a first and a second analogue indata port 103 and 101, and analogue outdata port 105. The indata/outdata-unit 99 further comprises A/D-converters connected to the indata port 101 and 103 and a D/A-converter connected to outdata port 105. The control unit 97 is connected to the indata/outdata-unit 99 in such a way that that it may control where and when indata and outdata is to be obtained and to be emitted, respectively. In FIG. 9 the first and the second indata port 101 and 103, respectively, are connected to the in-phase signal and the quadrature phase signal output 93 and 95, respectively, and the outdata port 105 is connected to the correction signal input 81.

The device in FIG. 9 may be used for obtaining a oscillator signal cos($\phi$ (t)) having a predetermined frequency variation $f_D(t)$; the device may specifically be used for obtaining a linear frequency variation, wherein any of the control sequences described according to the present invention may be used.

The control unit 97 may thus in combination with the indata/outdata unit 99 accomplish an A/D-conversion of the quadrature signals I(t) and Q(t) at a number of points of time $t_k$, whereby time discrete quadrature signals $I_k$ and $Q_k$ are obtained.

On the basis of the time discrete quadrature signals $I_k$ and $Q_k$ the control unit may further generate a time discrete approximation signal $Z_k$, indicating the real frequency slope $\mu(t)$ of the oscillator signal cos($\phi$ (t)). The control unit 97 further generates in dependence of the time discrete approximation signal $Z_k$ a time discrete error indication signal $e_k$, indicating the deviation of the oscillator signal cos($\phi$ (t)) actual frequency slope $\mu(t)$ from the desired frequency slope $\mu_D$, corresponding to the desired linear frequency variation $f_D(t)$. The control unit 97 in combination with the indata/outdata port 99 may further in dependence of the time discrete error indication signal $e_k$ generate a correction signal K(t), which is emitted through the outdata port 105. The generation of the correction signal K(t) may be adaptive, whereby the stored correction values are stored in the control unit 97 memory means.

The manner in which the device in FIG. 9 is adapted to determine the oscillator frequency slope–i.e. by forming a time discrete approximation signal $Z_k$—may of course be used in other devices where it is desirable to determine the frequency slope of an oscillator signal, e.g. in other types of devices for the control of a controllable oscillator.

What is claimed is:

1. Method for control of an oscillator signal (cos($\phi$(t))) from a controllable oscillator (13) during a time period ($\tau$) when the frequency (f(t)) of the oscillator signal (cos($\phi$ (t))) is intended to vary linearly with time corresponding to a predetermined frequency slope ($\mu_0$), whereat the oscillator (13) is controlled by a control signal (V(t)) which is modified during the time period ($\tau$) in dependence of a correction signal (K(t)) characterised by:

a) quadrature demodulation of the oscillator signal (cos($\phi$ (t))) with respect to a constant frequency ($\omega_0/2\pi$), whereby a first quadrature signal (I(t)) (in-phase) exhibiting a secondary phase ($\theta(t)$) and a second quadrature signal (Q(t)) (quadrature phase) exhibiting a phase difference $\pi/2$ to the secondary phase ($\theta(t)$) are generated;

b) A/D-conversion (31,29) of the quadrature signals (the in-phase and the quadrature phase signals) (I(t), Q(t)) at predetermined points of time ($t_k$; k=0,1, . . . , N) during the time period ($\tau$), whereby time discrete quadrature signals ($I_k$, $Q_k$; k=0,1, . . . , N) are generated;

c) generation of a time discrete approximation signal ($Z_k$; k=0, 1, . . . N) in dependence of the time discrete quadrature signals ($I_k$, $Q_k$), such that the signal value ($Z_n$) of the time discrete approximations signal, corresponding to given point of time ($t_n$) represents an approximation of the second time derivative ($\theta(t_n)$) of the secondary phase (On) at the given point of time ($t_n$);

d) generation of a time discrete error indication signal ($e_k$; k=0,1, . . . , N) in dependence of the time discrete approximation signal ($Z_k$), such that the signal value ($e_n$) of the time discrete error indication signal, corresponding to a given point of time ($t_n$), indicates the deviation of the frequency slope ($\mu(t_n)$) of the oscillator signal (cos($\phi$ (t))) at the given point of time ($t_n$) from the predetermined frequency slope ($\mu_0$);

e) generation of the correction signal (K(t)) in dependence of the time discrete error indication signal ($e_k$).

2. Method according to claim 1, characterised in that:

f) step c) comprises generation of a time discrete differential signal ($Y_k$; k=0,1, . . . , N) in dependence of the time discrete quadrature signals ($I_k$, $Q_k$), such that signal value ($Y_n$) of the time discrete differential signal, corresponding to a given point of time ($t_n$), represents a difference ($\Delta^-\theta_n$n) between the secondary phase ($\theta_n$) at the given point of time ($t_n$) and the secondary phase ($\theta_{n-1}$) at the immediately preceding point of time ($t_{n-1}$);

g) and that step c) comprises that the generation of the time discrete approximation signal ($Z_k$) is performed in dependence of the time discrete differential signal ($Y_k$), such that the signal value ($Z_n$) of the time discrete approximation signal, corresponding to a given point of time ($t_n$), represents a difference ($\Delta^{2-}\theta_n$) between the difference ($\Delta^-\theta_n$) which is represented by the signal value ($Y_n$) of the time discrete differential signal corresponding to the given point of time ($t_n$), and the difference ($\Delta^-\theta_{n-1}$), which is represented by the signal value ($Y_{n-1}$) of the time discrete differential signal corresponding to the immediately preceding point of time ($t_{n-1}$).

3. Method according to claim 2 characterised in that:

h) step f) comprises generation of a first time discrete complex signal ($X_k$; k=0,1, ..., N), such that the signal value ($X_n$) of the first time discrete complex signal corresponding to a given point of time ($t_n$), exhibits a real part and an imaginary part, resp., corresponding to said first and said second time discrete quadrature signals ($I_n$, $Q_n$) at the given point in time ($t_n$);

i) and that step f) comprises that the generation of the time discrete differential signal ($Y_k$) is performed such that its signal value ($Y_n$), corresponding to a given point of time ($t_n$), corresponds to the value of a multiplication (35) of the signal value ($X_n$) of the first time discrete complex signal corresponding to the given point of time ($t_n$) and the signal value ($X^*_{n-1}$) of the complex conjugate of the first time discrete complex signal corresponding to the immediately preceding point of time ($t_{n-1}$).

4. Method according to claim 3, characterised in that:

j) step g) comprises that the generation of the time discrete approximation signal ($Z_k$) is performed such that its signal value ($Z_n$), corresponding to a given point of time ($t_n$), corresponds to the value of a multiplication (39) of the signal value ($Y_n$) of the time discrete differential signal, corresponding to the given point of time ($t_n$), and the signal value ($Y_{n-1}^*$) of the complex conjugate of the time discrete differential signal, corresponding to the immediately preceding point of time ($t_{n-1}$).

5. Method according to claim 4 characterised in:

k) storing of stored correction values ($K_k$; k=0,1, ..., N) corresponding to each one of the points of time (($t_k$)), whereby the storing is performed preceding the start of the time period ($\tau$);

l) and that step e) comprises that the generation of the correction signal (K(t)) is performed also in dependence of the stored correction values ($K_k$).

6. Method according to claim 5 characterised in that:

m) step l) comprises time discrete low pass filtering (49) of the time discrete error indication signal ($e_k$), whereby a first time discrete low pass signal (LP1($e_k$); k=0,1, ..., N) is generated;

n) step l) comprises time discrete low pass filtering (51) of the stored correction values ($K_k$), whereat a second time discrete low pass signal (LP2($K_k$); k=0,1, ..., N) is generated;

o) step l) comprises generation of new correction values ($\hat{K}_k$; k=0,1, ..., N) in dependence of the time discrete first and second low pass signals (LP1($e_k$), LP2(K(t)));

p) and step l) comprises generation of the correction signal by a D/A-conversion (55) of the new correction values ($\hat{K}_k$).

7. Method according to claim 6, characterised in that:

q) the time discrete low pass filtering (51) in step m) is a causal FIR-filtering.

8. Method according to claim 7, characterised in that:

r) the time discrete low pass filtering (51) in step n) is a FIR-filtering.

9. Method according to claim 8 characterised in that:

s) step o) comprises that the new correction value ($\hat{K}_n$), corresponding to a given point of time ($t_n$), is generated so as to correspond to the value of the addition (53) of the signal values (LP1($e_n$), LP2($K_n$)) of the first and the second time discrete low pass signals corresponding to the given point of time ($t_n$).

10. Method according to claim 9, characterised in that:

t) modification of the stored correction values ($K_k$), such that the stored correction value ($K_n$), corresponding to a given point of time ($t_n$), is modified such as to correspond to the new correction value ($\hat{K}_n$), corresponding to the given point of time ($t_n$).

11. A device for generation of an of an oscillator signal (cos($\phi$ (t))) having a predetermined frequency variation ($f_D(t)$), whereby the frequency variation ($f_D(t)$) comprises at least one time period ($\tau$) during which the frequency (f(t)) is intended to vary linearly with time corresponding to one for the time period ($\tau$) predetermined frequency slope ($\mu_0$), comprising:

a controllable oscillator (71), having a control signal input (75) and an oscillator signal output (73), whereby the controllable oscillator (71) is arranged to emit, via the oscillator signal output(73), an oscillator signal (cos($\phi$ (t))), the frequency of which (f(t)) depends on a control signal (V(t)) received via the control signal input (75);

a control signal generator (77), which in turn comprises a control signal output (79) and a correction signal input (81), the control signal output (79) being connected to the control signal input (75) of the controllable oscillator (71), whereby the control signal generator (77) is adapted to emit via the control signal output (79) the control signal (V(t)) which is modified in dependence of a via the correction signal input (81) received correction signal (K(t)), characterised in that:

the device comprises means (87,89) for quadrature demodulation of the oscillator signal (cos($\phi$(t))) with respect to a constant frequency $\omega_0/2\pi$, the means for quadrature modulation (87,89), comprising a first and a second quadrature signal output (93,95), whereby the means for quadrature modulation (87,89) are adapted to emit a first quadrature signal (I(t)) (an in-phase) having a secondary phase ($\theta_n$) and a second quadrature signal (Q(t)) (a quadrature phase), having a phase separated $\Pi/2$ from the secondary phase ($v_n$), via the first and a second quadrature signal output (93,95);

the device comprises means (97,99) for A/D-conversion of the quadrature signals (I(t), Q(t)), whereby the means (97,99) for A/D-conversion are adapted to A/D-conversion at a number of points of time ($t_k$; k=0,1, ..., N) during the time period ($\tau$) and to thereby generate time discrete quadrature signals ($I_k$, $Q_k$; k=0,1, ..., N);

the device comprises means (97) for generating a time discrete approximation signal ($Z_k$; k=0,1, ..., N) in dependence of the time discrete quadrature signals ($I_k$, $Q_k$), such that the signal value ($Z_n$) of the time discrete approximations signal, corresponding to given point of time ($t_n$), represents an approximation of the second time derivative ($\theta(t)$) of the secondary phase at the given point of time ($t_n$);

the device comprises means (97) for generation of a time discrete error indication signal ($e_k$; k=0,1, ..., N) in dependence of the time discrete approximation signals ($Z_k$), such that the signal value ($e_n$) of the time discrete error indication signal, corresponding to a given point of time ($t_n$) indicates the deviation of the frequency slope ($\mu(t_n)$) of the oscillator signal ($\cos(\phi(t))$) at the given point of time ($t_n$) from the predetermined frequency slope ($\mu_0$); and that, the device comprises means (97,99) for generation of the correction signal ($K(t)$) in dependence of the time discrete error indication signal ($e_k$), whereby the means (97,99) for generation of the correction signal ($K(t)$), are connected to the correction signal input (81).

12. The device according to claim 11, characterised in that:

the device comprises a control unit (97), having memory means, processor means, clock means, and program; and that the device comprises an analog input/output unit (99), having a first and a second analog input port (101,103) and an analog output port (105), wherein the first and the second analog input port (101,103), respectively, are connected to said first and said second quadrature signal output (93,95) and the output port (105) is connected to the correction signal input (81), whereat the input/output unit (99) is connected to the control unit (97).

13. The device according to claim 12, characterised in that the means (97,99) for A/D-conversion of the quadrature signals ($I(t)$, $Q(t)$) consist of the control unit (97) in combination with the input/output unit (99).

14. The device according to claim 12, characterised in that the means (97) for generation of the time discrete approximation signal ($Z_k$) consist of the control unit (97).

15. The device according to claim 12, characterised in that the means (97) for generation of time discrete error indication signal ($e_k$) consist of the control unit (97).

16. The device according to claim 12, characterised in that the means (97,99) for generation of the correction signal ($K(t)$) consist of the control unit in combination with the input/output unit (99).

17. The device according to claim 11, characterised in that the means (87,89) for quadrature demodulation of the oscillator signal ($\cos(\phi(t))$) comprises a quadratur. demodulator (89), having a signal input (91) and the quadrature signal outputs (93,95); and that the means (87,89) for quadrature demodulation of the oscillator signal ($\cos(\phi(t))$) comprises a measurement means (87) for the measurement of the oscillator signal ($\cos(\phi(t))$), whereby the measurement means are connected to the oscillator signal output (73) and also connected to the quadrature demodulator (89) signal input (91).

18. The device according to claim 17, characterised in that the measurement means (87) is a coupler (87).

19. A method for establishing of an oscillator signal frequency slope characterized in:

a) quadrature demodulation of the oscillator signal ($\cos(\phi(t))$) with respect to a constant frequency ($\omega_0/2\pi$), whereby a first quadrature signal ($I(t)$) (in-phase) exhibiting a secondary phase ($\theta(t)$) and a second quadrature signal ($Q(t)$) (quadrature phase) exhibiting a phase difference $\pi/2$ to the secondary phase ($\theta(t)$) are generated;

b) A/D-conversion (31,29) of the quadrature signals ($I(t)$, $Q(t)$) at a number of points of time ($t_k$), whereby time discrete quadrature signals ($I_k$, $Q_k$) are generated;

c) generation of a time discrete approximation signal ($Z_k$), in dependence of the time discrete quadrature signals ($I_k$, $Q_k$), such that the signal value ($Z_n$) of the time discrete approximation signal, corresponding to a given time position ($t_n$), represents an approximation of the second time derivative ($\ddot{\theta}(t_n)$) of the secondary phase ($\theta_n$) at the given point of time ($t_n$); whereby the approximation signal ($Z_k$) establishes the frequency slope ($\mu(t)$) of the oscillator signal ($\cos(\phi(t))$), since this frequency slope ($\mu(t)$) is directly related to the second time derivative $\ddot{\theta}(t)$) of the secondary phase ($\ddot{\theta}(t)$).

20. The method according to claim 19, characterised in that:

d) step c) comprises generation of a time discrete differential signal ($Y_k$) in dependence of the time discrete quadrature signals ($I_k$, $Q_k$) such that the signal value ($Y_n$) of the time discrete differential signal, corresponding to a given point of time ($t_n$) represents a difference ($\Delta^-\theta_n$) between the secondary phase ($\theta_n$) at the given point of time ($t_n$) and the secondary phase ($\theta_{n-1}$) at the immediately preceding point of time ($t_{n-1}$)

e) and that step c) comprises that the generation of the time discrete approximation signal ($Z_k$) is performed in dependence of the time discrete differential signal ($Y_k$), such that the signal value ($Z_n$) of the time discrete approximation signal, corresponding to a given point of time ($t_n$), represents a difference (($\Delta^-)^2\theta_n$) between the difference ($\Delta^-\theta_n$), which is represented by the signal value ($Y_n$) of the time discrete differential signal, corresponding to the given point of time ($t_n$), and the difference ($\Delta^-\theta_{n-1}$), which is represented by the signal value ($Y_{n-1}$) of the time discrete differential signal corresponding to the immediately preceding point of time ($t_{n-1}$).

21. The method according to claim 20, characterised in that:.

f) step d) comprises generation of a first time discrete complex signal ($X_k$), such that the the signal value ($X_n$) of the first time discrete complex signal corresponding to a given point of time ($t_n$) exhibites a real and an imaginary part corresponding to the time discrete first and second quadrature signal values ($I_n$,$Q_n$) at the given point of time ($t_n$);

g) and that step d) comprises that the generation of the time discrete differential signal ($Y_k$) is performed such that its signal value ($Y_n$), corresponding to a given point of ($t_n$), corresponds to the value of a multiplication (35) of the signal value ($X_n$) of the first time discrete complex signal, corresponding to given point of time ($t_n$), and the signal value ($X^*_{n-1}$) of the complex conjugate of the first time discrete complex signal corresponding to the immediately preceding point of time ($t_{n-1}$).

22. The method according to claim 21, characterised in that:

h) step e) comprises that the generation of the time discrete approximation signal ($Z_k$) is performed such that its signal value ($Z_n$), corresponding to a given point of time ($t_n$), corresponds to the value of a multiplication (39) between the signal value ($Y_n$) of the time discrete differential signal, corresponding to the given point of time ($t_n$), and the complex conjugate of the signal value ($Y_{n-1}^*$) of the time discrete complex signal, corresponding to the immediately preceeding point of time ($t_{n-1}$).

* * * * *